United States Patent
Takizawa et al.

(10) Patent No.: US 7,847,546 B2
(45) Date of Patent: Dec. 7, 2010

(54) MAGNETIC RESONANCE IMAGING APPARATUS

(75) Inventors: Masahiro Takizawa, Tokyo (JP); Tetsuhiko Takahashi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 489 days.

(21) Appl. No.: 11/996,865

(22) PCT Filed: Jul. 25, 2006

(86) PCT No.: PCT/JP2006/314617

§ 371 (c)(1),
(2), (4) Date: Jan. 25, 2008

(87) PCT Pub. No.: WO2007/013423

PCT Pub. Date: Feb. 1, 2007

(65) Prior Publication Data

US 2010/0141253 A1    Jun. 10, 2010

(30) Foreign Application Priority Data

Jul. 27, 2005    (JP)    ............... 2005-216660

(51) Int. Cl.
*G01V 3/00*    (2006.01)
(52) U.S. Cl. ...................... 324/307; 324/309
(58) Field of Classification Search ......... 324/300–324; 600/407–445
See application file for complete search history.

(56) References Cited

U.S. PATENT DOCUMENTS 6,411,089 B1    6/2002    Anand et al.
6,859,033 B2 *   2/2005    Speier .................. 324/303

(Continued)

FOREIGN PATENT DOCUMENTS

JP    2004-519288    7/2004

OTHER PUBLICATIONS

Ajit Shankaranarayanan et al., "Two-Step Navigatorless Correction Algorithm for Radial k-Space MRI Acquisitions," *Magnetic Resonance in Medicine*, Feb. 2002, vol. 45, No. 2 pp. 277-288.

(Continued)

*Primary Examiner*—Brij B Shrivastav
(74) *Attorney, Agent, or Firm*—Cooper & Dunham LLP

(57) ABSTRACT

An MRI apparatus includes an imaging means being provided with a means for generating magnetic fields respectively of a static magnetic field, a gradient magnetic field, and an RF magnetic field, and a means for receiving an echo signal generated from a subject, the imaging means being for measuring echo data associated with at least one measurement trajectory in k-space, while varying angles with respect to a coordinate axis in the k-space of the measurement trajectory, so as to collect at least one measured data for each of the angles; and an image reconstruction means for rearranging the measured data in the k-space and reconstructing an image; wherein, the image reconstruction means calculates a phase for correction based on standard data selected from the measured data for each of the angles, prior to rearranging the measured data in the k-space, and performs a phase correction as to the measured data, by using the phase for correction being calculated. With the procedure above, it is possible to reduce an artifact caused by the nonlinearity of the gradient magnetic field and/or inhomogeneities of the magnetic field, without extending the imaging time.

18 Claims, 12 Drawing Sheets

U.S. PATENT DOCUMENTS

| | | | |
|---|---|---|---|
| 7,230,424 B1 * | 6/2007 | Morrone, Terry | 324/309 |
| 7,539,528 B2 * | 5/2009 | Xiong et al. | 600/411 |
| 7,560,925 B1 * | 7/2009 | Nishimura et al. | 324/309 |
| 7,646,274 B2 * | 1/2010 | Rapoport | 335/296 |
| 2008/0012565 A1 * | 1/2008 | McKenzie et al. | 324/309 |
| 2009/0209831 A1 * | 8/2009 | Kucharczyk et al. | 600/301 |

OTHER PUBLICATIONS

James G. Pipe et al., "Multishot Diffusion-Weighted FSE Using Propeller MRI," *Magnetic Resonance in Medicine*, Jan. 2002, vol. 47, No. 1, pp. 42-52.

Dana C. Peters et al., "Centering the Projection Reconstruction Reducing Gradient Delay Errors," *Magnetic Resonance in Medicine*, Jul. 2003, vol. 50, No. 1, pp. 1-6.

Chunlei Liu et al., "Simultaneous Phase Correction and SENSE Reconstruction for Navigated Multi-Shot DWI with Non-Cartesian k-Space Sampling," *Magnetic Resonance in Medicine*, Dec. 2005, vol. 54, No. 6, pp. 1412-1422.

\* cited by examiner

MAGNETIC RESONANCE IMAGING APPARATUS

TECHNICAL FIELD

The present invention relates to a magnetic resonance imaging (hereinafter, referred to as "MRI") apparatus that obtains a tomographic image of an area to be examined, by using a nuclear magnetic resonance (hereinafter, referred to as "NMR"). More particularly, it relates to a technique to reduce an artifact that occurs when a sequence is used, in which sampling is conducted radially in the k-space.

BACKGROUND ART

In the MRI apparatus, when a subject is in motion while imaging is performed, such motion may exert an influence on all over the image, and cause an artifact (hereinafter, it is briefly referred to as "motion artifact") which looks like a flowing of an image in the phase encoding direction. Such artifact occurs, because when echo signals of respective lattice points in a data space, which is generally called as "k-space", are sampled, the sampling parallel to a frequency encoding direction is repeated in the phase encoding direction (hereinafter, referred to as "Cartesian sampling method").

As against this Cartesian sampling method, there is a technique referred to as "Non-Cartesian sampling method". Examples of this Non-Cartesian sampling method may include radial sampling method (non-patent document 1), and hybrid radial method (non-patent document 2, referred to as "propeller MRI method" in this document) that combines the phase encoding with the radial sampling method.

The radial sampling method is a technique in which sampling is conducted radially, while a rotation angle is changed, setting approximately one point (generally original point) in the k-space as the rotation center, thereby obtaining echo signals which are required for reconstructing one piece of image. When imaging is performed by using the radial sampling method, the motion artifacts spread out peripherally on the image (i.e., they go out of a focused FOV), since the sampling is conducted radially. Therefore, it is said that compared to an imaging by the Cartesian sampling method, the radial sampling method makes the motion artifact inconspicuous and it is robust against the body motion.

However, the radial sampling method acquires the k-space radially, and therefore, a distribution of a readout gradient magnetic field within an imaging plane varies with respect to each echo signal. Therefore, if there are inhomogeneities in the magnetic field and/or nonlinearity in the gradient magnetic field, an influence therefrom varies from one echo signal to another. In other words, a gradient magnetic field to be applied in executing a sequence, which is calculated based on the coordinates in the k-space, is different from the gradient magnetic field actually applied in acquiring an echo signal, and therefore, the echo signal cannot be placed on a proper coordinate within the k-space. Given the situation above, compared to the Cartesian sampling method, there is found a problem that the radial sampling method may easily generate an artifact in the image, due to the nonlinearity of the gradient magnetic field and/or the magnetic field inhomogeneities. In order to correct the artifact in the radial sampling method, there is a technique to measure in advance the nonlinearity of the gradient magnetic field before executing the sequence, and the result of the measurement is reflected in a real measurement (non-patent document 3).

[Non-Patent Document 1]

G. H. Glover et al, Projection Reconstruction Techniques for Reduction of Motion Effects in MRI, Magnetic Resonance in Medicine 28: 275-289 (1992)

[Non-Patent Document 2]

James G. Pipe, Motion Correction With PROPELLER MRI: Application to Head Motion and Free-Breathing Cardiac Imaging, Magnetic Resonance in Medicine 42: 963-969 (1999)

[Non-Patent Document 3]

D. C. Peters et al, Centering the Projection Reconstruction Trajectory Reducing Gradient Delay Errors, Magnetic Resonance in Medicine 50: 1-6 (2003)

DISCLOSURE OF THE INVENTION

Problem to be solved by the Invention

According to the technique disclosed by the non-patent document 3, an additional measurement is necessary to obtain the nonlinearity of the gradient magnetic field. Therefore, there is a problem that the total imaging time is extended. The present invention has been achieved to solve the above problem, and an object of the present invention is to reduce the artifact caused by the nonlinearity of the gradient magnetic field and/or the magnetic field inhomogeneities, without measuring additional data, nor extending the imaging time, in the radial sampling method or in the hybrid radial method.

Means to Solve the Problem

In order to solve the problem, an MRI apparatus according to the present invention includes:

an imaging means being provided with a means for generating magnetic fields respectively of a static magnetic field, a gradient magnetic field, and an RF magnetic field, and a means for receiving an echo signal generated from a subject, the imaging means being for measuring echo data associated with at least one measurement trajectory in k-space, while varying angles of the measurement trajectory with respect to a coordinate axis in the k-space, so as to collect at least one measured data for each of the angles; and an image reconstruction means for rearranging the measured data in the k-space and reconstructing an image; wherein, the image reconstruction means is further provided with a phase correction means for calculating a phase for correction based on standard data selected from the measured data for each of the angles, prior to rearranging the measured data in the k-space, and for performing a phase correction as to the measured data, by using the phase for correction being calculated.

The MRI apparatus according to the present invention can be applied to an MRI apparatus that conducts measurement using the radial sampling method or the hybrid radial method, for instance. In the former case, the imaging means measures one echo associated with the measurement trajectory as to one angle, and the image reconstruction means sets this one echo as the standard data. In the latter case, the imaging means measures, as to one angle, echoes associated with multiple parallel trajectories to which phase encoding has been applied, and the image reconstruction means sets at least one echo selected from the multiple echoes as the standard data. It is to be noted that in the present invention, the "measurement trajectory" indicates a virtual line rendered in the k-space by the echo data that is arranged in the k-space, and the measurement trajectory is determined by the gradient magnetic field that is imparted to generate one echo. In addition, the "parallel trajectories" indicates measurement trajectories that are parallel with one another in the k-space.

In the MRI apparatus according to the present invention, it is possible to reduce the artifact caused by the nonlinearity of the gradient magnetic field and/or the static magnetic field inhomogeneities in the radial sampling method and the hybrid radial method.

In the MRI apparatus according to the present invention, the phase correction means subjects the standard data to the Fourier transform with respect to one coordinate axis in the k-space, for instance. Then, a phase of the transformed data at the position where the subject exists is set as the phase for correction. Alternatively, the standard data is subjected to the Fourier transform with respect to one coordinate axis in the k-space, and the phase of the transformed data is set as the phase for correction. Then, correction is made as to each coordinate position. Further alternatively, the standard data is subjected to the Fourier transform with respect to one coordinate axis in the k-space, and the phase of the transformed data is fitted to a function and this phase is set as the phase for correction.

The MRI apparatus according to the present invention can also be applied to an MRI apparatus that takes images serially. For example, the imaging means measures echo data associated with at least one measurement trajectory in the k-space, while changing the angle of this measurement trajectory with respect to the coordinate axis in the k-space, and repeats acquiring of a set of measurement data. The phase correction means selects one of the sets of measurement data to calculate the phase for correction, and corrects the other measurement data by using this phase for correction.

Moreover, the MRI apparatus according to the present invention can be applied to an MRI apparatus that takes an image while a bed on which the subject is placed is moved. By way of example, the MRI apparatus according to the present invention is further provided with a transfer means for moving the subject in the static magnetic field, wherein, the imaging means repeats acquiring sets of measured data, as to the echo data associated with at least one measurement trajectory in the k-space, while varying the angles of the measurement trajectory with respect to the coordinate axis in the k-space, in sync with moving of the subject by the transfer means, and the phase correction means updates, in the repetition, the phase for correction for each acquisition of the at least one of the sets of the measured data, and corrects the phase by applying the phase for correction having been updated to the measured data acquired after the updating.

EFFECT OF THE INVENTION

According to the present invention, in the radial sampling method or the hybrid radial method that combines the radial sampling method with the phase encoding, a peak deviation of echo signals, which is caused by static magnetic field inhomogeneities and/or nonlinearity of the gradient magnetic field, is calculated based on acquired data and it is corrected. Thus, an artifact such as signal disappearance can be reduced, which is caused by the static magnetic field inhomogeneities and/or the nonlinearity of the gradient magnetic field, without conducting additional data measurement nor extending the imaging time.

BEST MODE FOR CARRYING OUT THE INVENTION

Hereinafter, preferred embodiments of the present invention will be explained with reference to the accompanying drawings. It is to be noted here that in the entire drawings to explain the embodiments of the invention, the elements having the same functions are indicated with the same sign, and tedious explanations will not be given.

FIG. 1 is a block diagram showing an overall structure of an MRI apparatus to which the present invention is applied. This MRI apparatus is to obtain a tomographic image of a subject by using the phenomenon of NMR, and as shown in FIG. 1, it is provided with a static magnetic field generating unit 2, a gradient magnetic field generating unit 3, a transmitting unit 5, a receiving unit 6, a signal processing unit 7, a sequencer 4, and a central processing unit (CPU) 8.

The static magnetic field generating unit 2 generates homogeneous static magnetic field in the body axis direction or in the direction orthogonal to the body axis direction in the surrounding space of the subject 1, and around the subject 1, there are arranged a magnetic generation means which is a permanent magnet, a normal conducting magnet, or a superconducting magnet.

The gradient magnetic field generating unit 3 is made up of gradient magnetic field coils 9 being wound in three directions X, Y, and Z, and a gradient magnetic field power supply 10 for driving each of the gradient magnetic field coils. According to a command from the sequencer 4 described below, the gradient magnetic field supply 10 of each of the coils is driven, thereby applying the gradient magnetic field in the direction of X, Y, or Z to the subject 1. By combining the gradient magnetic fields of the three axial directions, a slice direction gradient magnetic field pulse (Gs) is generated in any of the directions, and a slice plane for the subject 1 is configured. Simultaneously, in any of the directions, a phase encoding direction gradient magnetic field pulse (Gp) and a frequency encoding direction gradient magnetic field pulse (Gf) are generated, and thereby encoding an echo signal with positional information of each of the directions.

The sequencer 4 is a control means for repeatedly applying an RF magnetic field pulse (hereinafter, referred to as "RF pulse") and a gradient magnetic field pulse at a predetermined pulse sequence, and the sequencer is activated by a control from the CPU 8 to send various commands required for collecting tomographic image data of the subject 1, to the transmitting unit 5, the gradient magnetic field generating unit 3, and the receiving unit 6.

The transmitting unit 5 irradiates an RF pulse, so as to excite a nuclear magnetic resonance in a nuclear spin of each atomic element constituting a living tissue of the subject 1, and the transmitting unit is made up of an RF oscillator 11, a modulator 12, an RF amplifier 13, and an RF coil 14a on the transmitting side. An RF pulse outputted from the RF oscillator 11 is subjected to an amplitude modulation by the modulator 12 at the timing according to a command from the sequencer 4, and the RF pulse being subjected to the amplitude modulation is amplified by the RF amplifier 13. Thereafter, the pulse is supplied to the RF coil 14a placed in proximity to the subject 1, whereby an electromagnetic wave (RF pulse) is irradiated on the subject 1.

The receiving unit 6 detects an echo signal (NMR signal) emitted by the nuclear magnetic resonance in the nuclear spin of each atomic element constituting the living tissue of the subject 1, and the receiving unit is made up of an RF coil 14*b* on the receiving side, an amplifier 15, a quadrature phase detector 16, and an A/D converter 17. A response electromagnetic wave (NMR) from the subject that is induced by an electromagnetic wave irradiated from the RF coil 14*a* on the transmitting side is detected by the RF coil 14*b* arranged in proximity to the subject 1, and the NMR signal is amplified by the amplifier 15. Thereafter, divided into orthogonal two-system signals by the quadrature phase detector 16, and then, each signal is converted into a digital amount by the A/D converter 17, and transferred to the signal processing unit 7.

The signal processing unit 7 includes an external storage unit such as an optical disk 19 and a magnetic disk 18, and a display 20 made up of CRT and the like. When data from the receiving unit 6 is inputted into the CPU 8, the CPU 8 executes a processing such as a signal processing and an image reconstruction, and displays a resulting tomographic image of the subject 1 on the display 20, as well as recording the image in the external storage unit such as the magnetic disk 18.

In FIG. 1, the RF coils 14*a* and 14*b* respectively on the transmitting side and on the receiving side, and the gradient magnetic field coil 9 are placed within the static magnetic field space of the static magnetic filed generating unit 2, which is installed in the space surrounding the subject 1.

Currently, a spin species as an imaging target of the MRI apparatus, which can be used widely for a clinical purpose, is a proton being a primary constitutional element of the subject. By imaging a spatial distribution of the proton density, or the spatial distribution of relaxation phenomenon of excited state, anatomical images or functional images of a human head region, abdominal region, and extremities are taken two-dimensionally or three-dimensionally.

Next, an imaging method performed in the aforementioned MRI apparatus will be explained. FIG. 2 and FIG. 3 respectively illustrate examples of pulse sequence according to the radial sampling method (referred to as "radial MRI method" hereinafter), and according to the hybrid radial (also called as "propeller MRI") method, each being a pulse sequence of gradient echo system. FIG. 4 illustrates a pulse sequence according to the Cartesian sampling method, and FIG. 5(*a*), FIG. 5(*b*), and FIG. 5(*d*) respectively illustrate data arrangements in the k-space, as to the data acquired by these pulse sequences.

The terms "RF", "A/D", and "echo" in FIG. 2 to FIG. 4 respectively represent timing of the RF pulse 501, AD conversion (sampling window) 505, and an echo signal (603 in FIG. 2, 707 to 710 in FIG. 3, and 506 in FIG. 4). The terms "Gs", "Gp", "Gr" represent axes of the slice gradient magnetic field, the phase encoding gradient magnetic field, the frequency encoding gradient magnetic field, respectively. In the radial MRI method and in the hybrid radial method, the gradient magnetic fields of two axes Gp and Gr are applied, as a phase encoding gradient magnetic field pulse and a frequency encoding gradient magnetic field pulse. Reference numeral 507 in FIG. 2, 702 in FIG. 3, 507 in FIG. 4 each represents a repetition of measurement or a repetition time (intervals between RF pulses 501). As for the reference numeral 508 in FIG. 2, 701 in FIG. 3, and 508 in FIG. 4, each represents an image acquisition time.

Firstly, the pulse sequence according to the radial MRI method as shown in FIG. 2 will be explained. This pulse sequence is different from the Cartesian sampling method as shown in FIG. 4 in the following points; a gradient magnetic field 601 similar to the frequency encoding gradient magnetic field is applied also to the axis Gp of the phase encoding gradient magnetic field, and the amplitude varies, for each repetition 507 of the pulse sequence, as to the gradient magnetic fields 601 and 602 which are applied to the Gp axis and Gr axis, respectively. The vertical axis and the horizontal axis in the k-space are respectively associated with the axis of the phase encoding gradient magnetic field and the axis of the frequency encoding gradient magnetic field. Therefore, by using the amplitudes of the gradient magnetic fields 601 and 602, being different amount for each repetition 507 of the pulse sequence, it is possible to obtain data that is radially rotating about approximately one point in the k-space.

FIG. 5(*b*) illustrates a result obtained by arranging in the k-space the echo signals that are sampled by using the pulse sequence as shown in FIG. 2. FIG. 5(*b*) illustrates that after the repetition 507 of 12 times, the echo signals 603-1 to 603-*c* are respectively acquired in the repetitions. In the case above, rotation angle $\Delta\theta$ (802) required for embedding the k-space evenly is expressed by:

$$\Delta\theta = \pi/12 \quad (1)$$

In order to conduct the sampling as described above, gradient magnetic field outputs GP and GR respectively in the Gp axis and Gr axis are expressed as the following, when an output of the frequency encoding gradient magnetic field used in the Cartesian sampling method is assumed as G, and the repetition number is assumed as $n(1 \leq n \leq 12)$:

$$GP = G \times \sin(\Delta\theta \times (n-1)) \quad (2)$$

$$GR = G \times \cos(\Delta\theta \times (n-1)) \quad (3)$$

An advantage of the radial MRI method is that a resolution performance is preferable even with a smaller number of echo signals, and a ghost or an artifact due to a body motion may hardly occur, compared to the situation where the Cartesian sampling method is employed. In addition, by adjusting the rotation angle upon imaging, an influence on the image quality due to the body motion of the subject can be reduced.

The pulse sequence of the hybrid radial method is implemented by adding a phase encoding to the radial MRI method described above. As shown in FIG. 3, the measurement 701 is divided into multiple blocks (four in the figure) 702-1 to 702-4, and in each of the blocks, multiple echo signals (five in the figure) are acquired. This pulse sequence is distinguished from that of the radial MRI method shown in FIG. 2 in the point that a gradient magnetic field output is configured so that the rotation angle in the k-space varies for each of the blocks 702-1 to 702-4, and in each of the blocks 702-1 to 702-4, a phase encoding pulse is added. In FIG. 3, the gradient magnetic field pulses 703 and 704 are the pulses whose outputs vary according to the rotation angle, and the gradient magnetic field pulses 705 and 706 outputted before the gradient magnetic field pulses 703 and 704 are pulses for phase encoding. In the illustrated case, within the first block 702-1, five echo signals 707-1 to 707-5 are acquired each having different phase encoding amount 705-1, and thereafter shifting to the second block 702-2, five different echo signals 708-1 to 708-5 are acquired having the phase encoding amounts 705-2 and 706-2. The operation above is performed similarly for the third block 702-3 and the fourth block 702-4, and echo signals 709-1 to 709-5 and 710-1 to 710-5 are acquired. Then, all the echo signals necessary for reconstructing an image are acquired. It is to be noted that in the case illustrated in the figure, the sequence is executed in such a manner that the block 702-1 becomes parallel to Kx axis, and the block 702-3 becomes parallel to the Ky-axis (the block 702-1 and the block 702-3 are orthogonal to each other).

Therefore, a phase encoding component is not included in the gradient magnetic field blocks 706-1 and 705-3, and the output is kept constant.

A resulting arrangement of the echo signals acquired as described above in the k-space is shown in FIG. 5(*d*). In this case, five echo signals are acquired, rotating at the angle 804 with respect to each of the blocks 702-1 to 702-4 and each echo signal having different phase encoding amount in each of the blocks. For example, in the first block 702-1, five echo signal groups 707-1 to 707-5 each having different phase encoding amount are acquired, and in the second block 702-2, similar to the first block, five echo signal groups 708-1 to 708-5 each having different phase encoding amount are acquired. When these block data items are arranged in the k-space, the block data items become 805-1 and 805-2, respectively, and there is a difference of angle 804 between the blocks. It is to be noted that in the hybrid radial method, a block indicating a unit of measurement for each rotation angle, is also referred to as "blade".

The data obtained by the radial MRI method and by the hybrid radial method are not placed on a regular lattice coordinates in the k-space. Given this situation, by using an interpolating process based on the sampled data, a gridding process is performed to produce data that are placed on the regular lattice coordinates. By way of example, the non-patent document 4 describes the gridding process. It will be briefly explained in the following.

[Non-Patent Document 4]

J. I. Jackson et al, Selection of a Convolution Function for Fourier Inversion Using Gridding, IEEE Trans. Med. Imaging, vol. 10, pp. 473-478

FIG. 5(*c*) schematically illustrates the data acquired by the non-Cartesian sampling method, which has been subjected to the gridding process and arranged in the k-space. The k-space 801 has the coordinates of regular lattice points as illustrated by black dots in FIG. 5(*c*). However, since the data acquired by the non-Cartesian sampling method traces the trajectory (coordinates) different from the k-space, the sampled data being represented by white dots do not agree with the coordinates of the lattice points (black dots in FIG. 5(*c*)) in the k-space. In the gridding process, by using the sampled data (white dots in the figure), the data is rearranged on the regular lattice coordinates (black dots in FIG. 5(*c*)) according to an interpolation process. Such interpolation process is performed by using a function for interpolation, such as Sinc function and Kaiser-Bessel function.

By performing the gridding process, an image can be reconstructed by subjecting the measured data to the Fourier transform in the same manner as the measured data obtained by the Cartesian sampling method. In the gridding process, the coordinates of the data represented by the white dots are treated as the coordinates determined by the amplitude of the gradient magnetic field which is set for acquiring that data (which is calculated in the formulas (2) and (3), for instance). However, if an error occurs in the gradient magnetic field being applied when the data is actually acquired, the gridding process is performed assuming that the data is placed on the coordinate (calculated coordinate), which is different from the coordinate on which the data is actually supposed to be arranged. Consequently, the image being reconstructed comes under the influence of the error. Given this situation, the signal processing unit of the MRI apparatus according to the present invention performs a process for the acquired data, prior to the gridding process, to correct the error of the gradient magnetic field.

At first, an explanation will be made as to the influence on the data, exerted by the error in the gradient magnetic field. By way of example, a situation will be explained, in which an error occurs on a readout gradient magnetic field axis while acquiring an echo signal. FIG. 6 illustrates one-time repetition of the sequence as shown in FIG. 3, showing (b) a state where a gradient magnetic field offset occurs due to the error in the readout gradient magnetic field axis, and (a) a state where there is no gradient magnetic field offset. When there is no errors, i.e., there is no gradient magnetic field offset, an echo signal 301 is generated at the time when an integral quantity of dephase gradient magnetic field pulse 301-1 applied to the readout gradient magnetic field axis and the readout gradient magnetic field pulse 302-1 becomes zero (namely, the area of "part A" becomes equal to the area of "part B" in the figure).

On the other hand, when there is a gradient magnetic field error in the readout gradient magnetic field direction, or there is an offset $-G_0$ due to the inhomogeneities of the static magnetic field, as shown in FIG. 6(*b*), total amount of the gradient magnetic field applied while acquiring the echo signal is equal to the amount obtained by adding the gradient magnetic field offset amount $-G_0$ to the applied amount of the readout gradient magnetic field pulse. Therefore, the area of dephase gradient magnetic field pulse 301-2 applied in the homopolarity of the gradient magnetic field offset apparently looks having a larger area (A'). On the other hand, the readout gradient magnetic field pulse 302-2 applied in the reverse polarity of the gradient magnetic field offset apparently looks having a smaller area (B'). Therefore, the time when the integral quantity of the gradient magnetic field pulse applied to the readout gradient magnetic field axis becomes zero shifts behind by $P_0$, compared to the case shown in FIG. 6(*a*).

Such a shift of peak position of the echo signal as described above may similarly occur due to a time lag in the rise time of the gradient magnetic field, nonlinearity of the gradient magnetic field, and inhomogeneities of the static magnetic field, in addition to the gradient magnetic field offset as described above. Here, these factors are collectively referred to as "gradient magnetic field error".

Referring to FIG. 7, an influence exerted by this gradient magnetic field error onto the measured data according to the radial MRI method will be explained. FIG. 7 magnifies the central part of the k-space and white dots represent the data points actually measured, and black dots represent the coordinates of the lattice points in the k-space. FIG. 7(*a*) illustrates an ideal state without any gradient magnetic field errors, and the data points on the echo signals 903 being measured are regularly arranged radially about one point (original point in FIG. 7) in the k-space.

On the other hand, if there is a deviation in peak position due to the gradient magnetic field error, when the echo signals are arranged in response to the rotational direction of the k-space, as shown in FIG. 7(*b*), the data point at the peak position is deviated from the original point, and the data points on the echo signals 904 do not form regularly radial shape. The gridding upon reconstruction uses the coordinate in calculating the sequence, in other words, the gridding is performed assuming that the measured data actually located on the white dots in FIG. 7(*b*) are located on the positions represented by the white dots in FIG. 7(*a*). Therefore, due to the influence from this error, a signal disappearance or the like occurs and the image quality is deteriorated, and then, causing an artifact. In the case of the hybrid radial method, there occurs an error similar as shown in FIG. 7(*b*), with respect to each rotation angle of the block 805 as shown in FIG. 5(*d*), thereby also causing an artifact. Since this gradient magnetic field error includes a component that may be changed depending on an application axis of the readout gradient magnetic field pulse, the influence from the gradient magnetic field error may vary in accordance with the rotation angle in the radial MRI method.

In view of the factors causing the artifact in the radial MRI method as described above, a preferred embodiment of a correction process in the MRI apparatus according to the present invention will be explained.

First Embodiment

A first embodiment of the MRI apparatus according to the present invention will be explained, with reference to FIG. 8. FIG. 8 is a flowchart showing each step of the correction process in executing the radial MRI method or the hybrid radial method. It is to be noted that the term "block" in FIG. 8 represents a unit for each rotation angle. In other words, in the radial MRI method, the block is associated with each echo signal (i.e., the number of blocks is equal to the number of projections), whereas in the hybrid radial method, the block is associated with the blade (i.e., the number of blocks is equal to the number of blades). Hereinafter, with reference to FIG. 8, each processing step will be explained in detail.

In step 101, one block is measured. Specifically, one echo signal is measured in the radial MRI method, whereas in the hybrid radial method, a group of echo signals belonging to one blade is measured.

In step 102, the echo signal acquired per block is subjected to one-dimensional Fourier transform, and echo data is obtained. Specifically, in the radial MRI method, one echo signal measured in step 101 is subjected to one-dimensional Fourier transform, whereas in the hybrid radial method, each signal in the group of echo signals belonging to one blade measured in step 101 is subjected to the one-dimensional Fourier transform.

In step 103, data as a standard for correction is selected from the echo data within the block. FIG. 9 illustrates one example for selecting the standard data. The diagonally shaded area represents a block selected as the standard. FIG. 9(a) illustrates the case of the radial MRI method, where the number of blocks is ten. In the case of the radial MRI method, only one echo is acquired in the block, the data in each block is assumed as standard data 110-1 to 110-a. FIG. 9(b) illustrates the case of the hybrid radial method, where the number of the blocks 111 is five and the number of echoes within the block is four. In the case of the hybrid radial method, since the rotation angle in the k-space is the same as to all the data within the group, it is only required to select one standard data 112 for each block. By way of example, a phase encoding different by data is added to each data within the block, but as the standard data, it is sufficient to select the data acquired without the phase encoding (data with the phase encoding being zero).

In step 104, a phase of the standard data selected in step 103 is calculated. In step 105, a phase for correcting the echo data within the block is produced based on the phase of the standard data calculated in step 104. A specific way for producing the phase for correction will be discussed below.

In step 106, by using the phase for correction produced in step 105, the echo data within the block is corrected. As the phase correction process, when a complex data as a correction target is assumed as C(n,x), and the phase for correction is assumed as φ(n,x), the data C'(n,x) after the correction is expressed by:

$$Re[C'(n,x)]=Re[C(n,x)]\times\cos(\phi(n,x))-Im[C(n,x)]\times\sin(\phi(n,x))$$

$$Im[C'(n,x)]=Im[C(n,x)]\times\cos(\phi(n,x))+Re[C(n,x)]\times\sin(\phi(n,x)) \quad (8)$$

(Here, Re[ ] and Im[ ] represent real part and an imaginary part of the data, respectively). In the radial MRI method, since each block has only one echo, the phase correction of the formula (8) is performed only for the standard data as to which the phase for correction is acquired. In the hybrid radial method, since there are multiple data items within the block, the phase correction of the formula (8) is performed for each data, by using the phase for correction that is produced based on the standard data.

In step 107, the echo signal as to which the phase correction has been made per block is subjected to the one-dimensional inverse Fourier transform, and the signal is resumed as the data in the k-space.

In step 108, it is determined whether or not the block is final, and if it is the final block, the processing shifts to the next step 109. If it is not the final block, the processing returns to step 101 via the step 10b, and the process of the subsequent block is performed. Then, the steps from steps 101 to 108 above are repeated until the block becomes the final. In other words, the step 101 to step 107 are repeated for each echo signal in the radial MRI method, and for each blade in the hybrid radial method.

In step 109, gridding is applied to all the block data after the phase correction has been made, and thereby obtaining data on each lattice point in the k-space. In step 10a, the k-space data to which the gridding has been applied in step 109 is subjected to a two-dimensional Fourier transform to obtain an image. Hereinabove, the flowchart shown in FIG. 8 has been explained.

Next, a specific way for producing the phase for correction that is performed in step 105 above will be explained. The phase for correction produced in step 105 may include the following examples, and any one of those examples is used as cp(n,x) in the formula (8). If a correction is made using the phase for correction as described in the following, according to the numerical order below, more accurate correction result can be achieved:

1. Phase Offset Component

When the k-space data is produced by applying gridding to the acquired echo signals, signals are canceled out each other, if the phase offset of each of the echo signals are different echo by echo, and accordingly deteriorating the image quality. Therefore, by calculating and correcting the phase offset component as to all the echo signals, such deterioration is improved. Since the phase offset component of the echo signal is the same in amount as the phase offset of the data after the Fourier transform, it is preferable to calculate the phase offset based on the standard data to make a correction. On this occasion, in order to avoid an influence from the first order component or a high order component of the phase, the phase offset is calculated by using the phase of the center coordinate of the standard data (e.g., if the number of data points of the standard data is X, at a position of X/2), according to:

$$\phi_0(n)=\arc\tan(Im[S(n,X/2)]/Re[S(n,X/2)]) \quad (4)$$

Here, S(n,x) represents the standard data within the block, n represents the block number, and x represents a position coordinate. This $\phi_0(n)$ is set as the phase for correction;

$$\phi(n,x)=\phi_0(n) \quad (5)$$

2. Simple Phase

In order to correct a deviation of the peak position with respect to each echo signal, the phase of the standard data, as it is, is used as the phase for correction, and a correction is made for the first order component of the phase, caused by the deviation of the peak position. Therefore, the phase for correction is expressed by:

$$\phi(n,x)=\arctan(Im[S(n,x)]/Re[S(n,x)]) \quad (6)$$

According to the phase correction using the simple phase as described above, as shown in FIG. 7(a), for example, a group of echo signals within the k-space after the phase correction is arranged in a rotational symmetry about a predetermined approximate one point (e.g., original point). In other words, the peak positions in the readout gradient magnetic field direction as to the echo signals for each block approximately agree with one another, and the signals are arranged in a rotational symmetry about the point of agreement. In addition, since the simple phase includes a phase offset component, by using the simple phase, the correction of the phase offset can be performed simultaneously.

3. Phase Fitting

In the case where inhomogeneities in the static magnetic field is large, or a fat content or the like is included in the imaging target, the phase may be rotated locally. Therefore, the phase of the standard data may include the above components, in addition to the component of the peak position deviation. Accordingly, if the phase of the standard data is used as it is, there is a possibility that the image contrast is distorted locally.

Given this situation, fitting to a predetermined function is performed on the calculated data, so as to eliminate an influence of the phase rotation, in addition to the influence of the peak position deviation. As for the fitting process, it is preferable that the phase of the standard data is unwrapped, and thereafter, the fitting is performed using a first order function or a function of a high order. By way of example, when a quadratic function is used as the function for fitting, and zero-order, first-order, and second-order factors after the fitting of each block are respectively assumed as $\phi_0(n)$, $\phi_1(n)$, and $\phi_2(n)$, the phase for correction is expressed by:

$$\phi(n,x)=\phi_2(n)\times x^2+\phi_1(n)\times x+\phi_0(n) \quad (7)$$

When the fitting order is assumed as the first-order, $\phi_2(n)=0$.

According to the phase correction by the phase fitting, the group of echo signals within the k-space after the phase correction is arranged in a rotational symmetry about a predetermined one point (e.g., original point), similar to the correction by using the simple phase as described in the item 2 above. However, compared to the case of the item 2, the phase component other than the phase component caused by the peak position deviation can be eliminated, and therefore, the degree of agreement of the peak positions of the echo signals with respect to each block can be further improved. Hereinabove, a specific method has been explained, for producing the phase for correction.

According to the present embodiment as described above, even when there is a deviation in the peak positions of the echo signals, caused by the inhomogeneities of the static magnetic field and/or nonlinearity of the gradient magnetic field, an artifact such as a signal disappearance of the image is reduced by correcting such deviation, and thereby improving the image quality.

Second Embodiment

Next, a second embodiment of the MRI apparatus according to the present invention will be explained. The present embodiment is different from the first embodiment in the following points; firstly total measurement 201 is conducted and thereafter data is corrected, and secondly, the standard data is not selected from each of the blocks but it can be selected from every desired number of blocks. FIG. 10 is a flowchart showing each step of the correction process when the radial MRI method or the hybrid radial method is executed. It is to be noted that the processing step representing the same process as in the flowchart of FIG. 8 is labeled with the same step number. The term "block" in FIG. 10 also represents a unit for each rotation angle, and this is the same as FIG. 8. Hereinafter, only the processing step different from the flowchart of FIG. 8 will be explained in detail, and as to the same processing step, only the overviews will be described.

In step 201, data of all the blocks is measured. In step 102, each of the echo signals of all the blocks is subjected to the one-dimensional Fourier transform, and echo data is obtained. In other words, the processing in step 102 as shown in FIG. 8 is performed as to all the blocks. In step 202, the standard data for acquiring a phase for correction is selected. The standard data may be selected from each block, similar to the step 103 of FIG. 8, or data from any one of the blocks may be discriminated and selected. An example of the selection is shown in FIG. 9(c). FIG. 9(c) illustrates the same measurement as FIG. 9(a), but as the standard data, only the data 113 is selected, and the data 114 is not selected as the standard data.

In step 104, similar to the step 104 in FIG. 8, a phase of the standard data selected in step 202 is calculated. In step 105, similar to the step 105 in FIG. 8, a phase for correcting the data within the block is produced, based on the phase of the standard data calculated in step 104. Any of the aforementioned items 1 to 3 (phase offset, simple phase, and phase fitting) may be employed for the phase correction.

In step 203, based on the phase for correction produced in step 105, an interpolating process for the phase for correction is performed. This interpolating process may not be performed, when the standard data is selected from each of the blocks. In the case where the standard data is selected from the blocks that are selected every optional number of blocks, the phase for correction for a non-selected block is obtained by interpolation using the phase for correction produced in the selected block.

As the interpolating process, the phase for correction $\psi(n,x)$ produced in each block is fitted to a predetermined function in the block direction (n-direction). By way of example, if the phase is fitted to a quadratic function, when assuming zero-order, first-order, and second-order factors after the fitting are respectively assumed as $\psi_0(x)$, $104_1(x)$, and $\psi_2(x)$, the phase for correction is expressed by:

$$\psi(n,x)=\psi_2(x)\times n^2+\psi_1(x)\times n+\psi_0(x) \quad (9)$$

This phase for correction is produced under consideration that a gradient magnetic field error, which is a problem in the radial MRI method or in the hybrid radial method, may vary depending on a ratio of the gradient magnetic field application axis.

By performing the interpolation process in the block direction, it is possible to create a phase for correction based on the data of a small number of blocks. In the case where the standard data of a block is extremely distorted and deteriorated, there is a possibility of rejecting the standard data. However, the above procedure may also be applied to this situation.

In step 106, similar to the step 106 of FIG. 8, by using the phase for correction ψ(n,x) for each block produced in step 203, the phase correction is performed on the data within the block, with respect to each block. In step 107, similar to the step 107 of FIG. 8, the echo signals as to which the phase correction has been performed per block are subjected to the one-dimensional inverse Fourier transform, and resumed to the data in the k-space. In step 109, similar to the step 109 of FIG. 8, gridding is applied to the phase-corrected data of all the blocks, and data on each lattice point in the k-space is obtained. In step 10a, similar to the step 10a of FIG. 8, the k-space data on which the gridding has been applied in step 109 is subjected to the two-dimensional Fourier transform, and an image is obtained. Hereinabove, an explanation has been made as to the flowchart shown in FIG. 10.

In the first and the second embodiments described above, an example has been explained, where the fitting is performed with a high order function in producing a phase for correction in step 105 (3. Phase fitting in paragraph 0051). In addition, it is possible to create the phase for correction using only a factor of specific order from the result of the fitting. In the case above, firstly the high order function is used as the fitting function, and a phase map after the fitting is obtained. Simultaneously, from the result (the phase map after the fitting), a first order component directly related to the peak position deviation is extracted, and this component is corrected. Accordingly, an accuracy of the phase map after the fitting is improved, and the correction can be made with a higher degree of accuracy than the case where a linear function is used as the fitting function from the beginning.

In addition, when the phase for correction is interpolated in step 203, only a factor of a specific order may be interpolated and used. This procedure is also advantageous for correcting only a component caused by the peak position deviation in the echoes.

Third Embodiment

Next, a third embodiment of the MRI apparatus according to the present invention will be explained. This preferred embodiment is applied to a phase correction of the data acquired by the hybrid radial method associated with the phase encoding. The present embodiment is the same as the first embodiment or the second embodiment, except a process for correcting the peak deviation in the phase encoding direction, which is added in the step for selecting the standard (step 103 or step 202) in the first embodiment or in the second embodiment.

In the hybrid radial sequence, data with the phase encoding is acquired for each block. On this occasion, if there is a peak deviation in the phase encoding direction (hereinafter, referred to as "PE direction") in the data acquired in each of the blocks, and if the data acquired without adding the phase encoding is selected as the standard data, this is not an optimum data.

Then, in the step for selecting the standard data (step 103 in the first embodiment and step 202 in the second embodiment), the processing steps 121 to 126 as shown in FIG. 11 are performed in the phase encoding direction. In step 121, the Fourier transform is performed in the PE direction. In step 122, the reference data in the PE direction is selected. As the reference data CPE(y) ($1 \leq y \leq Y$), when the data after the Fourier transform in the PE direction is assumed as I(x,y) ($1 \leq x \leq X, 1 \leq y \leq Y$), data at the center position (X/2, y) of the data points in the readout direction is selected, by way of example, and it is expressed as:

$$CPE(y)=I(X/2,y) \quad (10)$$

In step 123, by using the reference data CPE(y) in the PE direction produced by step 122, the phase for correction Φ(x, y) is produced. Here, it is expressed by:

$$\phi(x,y)=\arc\tan(Im[CPE(y)]/Re[CPE(y)]) \quad (11)$$

In order to improve the accuracy of the phase for correction Φ(x,y), it may be fitted to a function.

In step 124, by using the phase for correction Φ(x,y) produced in step 123, the phase correction is performed on the data within the block. As the phase correction process, a process similar to the formula (8) is performed. In step 125, the inverse Fourier transform is performed in the PE direction. In step 126, standard data for correction is selected. The processing above is the same as described in step 103 of the first embodiment, and in step 202 of the second embodiment.

As discussed above, according to the present embodiment, in addition to the effect of the first embodiment, even when the gradient magnetic field error varies depending on the application ratio of the gradient magnetic field application axis, an influence from the error is eliminated and the image quality is enhanced.

Fourth Embodiment

Next, a fourth embodiment of the MRI apparatus according to the present invention will be explained. In the embodiments from the first to the third as described above, an example of one-time imaging (phase correction as to data of one k-space) has been explained. On the other hand, in the present embodiment, the present invention is applied to a serial imaging such as a dynamic imaging and fluoroscopy. FIG. 12 schematically illustrates that the present invention is applied to the fluoroscopy (dynamic imaging), as one example of the serial imaging.

The fluoroscopy images an identical area of the subject sequentially, and repeats displaying and updating of the images obtained in time-series. Here, the imaging is performed according to the pulse sequence by the radial MRI method or the hybrid radial method. The time-series images 132 may be reconstructed by using independent k-space data 131-1 to 131-n, respectively. Alternatively, these images may be reconstructed, sharing a part of the k-space between the images being adjacent in time order with each other. In the illustrated embodiment, it is shown that the second image and subsequent images are reconstructed by sharing one-half of one k-space data between the adjacent images (echo sharing method).

Prior to the image reconstruction, the phase correction is performed on the k-space data acquired by the radial MRI method or by the hybrid radial method, in the rotation angle direction (block direction). The phase correction is performed in the same manner as the embodiments from the first to the third, as described above. Specifically, as to the k-space data, the data in each block is subjected to the one-dimensional Fourier transform, and standard data is selected from the data having been transformed. By using this standard data, a phase for correction is produced and phase correction is made for the data within the block. In the case of the hybrid radial method, additional phase correction may be performed for the data within the block so as to align the peak position of the data in the phase encoding direction.

The phase for correction used for correcting the phase may be produced every time when the k-space data enabling reconstruction of one piece of image is collected. However, if the gradient magnetic field error being a cause of the deviation of echo peak position does not include a time varying factor, it is possible to create the phase for correction just one time, and apply this phase to all the data for reconstructing the image. Alternatively, the phase for correction may be updated at a predetermined frequency (one time for multiple times) as to the k-space data acquired continuously, and by using the phase for correction being updated, the phase correction is made with respect to each block, for the data that is supplied subsequently for reconstructing an image.

In the embodiment as shown in FIG. 12, when the k-space data 131-1 enabling reconstruction of one piece of image is acquired, a phase for correction 133-1 is produced based on the measured data, and correction is made as to the k-space data 131-1. After gridding, an image is reconstructed, and one piece of image 132-1 is produced and displayed. As to the second piece of image 132-2, the image is reconstructed by using the data acquired in the latter half out of the k-space data 131-1 and the data acquired in the first half out of the k-space data 131-2. On this occasion, the phase of the data used for the image reconstruction is corrected by using the phase for correction 133-1 that is produced by using the k-space data 131-1. Hereinafter, until the k-space data 131-4 is acquired, the data used for reconstructing the images 132-3 to 132-6 is corrected by using the phase for correction 133-1. When the k-space data 131-4 is acquired, the phase for correction 133-2 is produced from this measured data, and it is used for correcting the subsequent data.

Fifth Embodiment

A fifth embodiment will be explained, in which the present invention is applied to a bed moving imaging. FIG. 13 schematically illustrates an example to which the phase correction according to the present invention is applied to the bed moving imaging method. The bed moving imaging is a technique for imaging a subject while moving the bed on which the subject is placed, relatively with respect to a static magnetic field space (imaging space), thereby imaging an area of the subject, being wider than an imaging space that is limited in size. When the radial MRI method or the hybrid radial method is applied to the bed moving imaging, the slice direction is not particularly limited, but in the figure, it is illustrated that the slice direction is set to be parallel to the bed moving direction. This imaging method enables an imaging similar to the spiral scanning in a CT device by continuously moving the bed. Here, however, a case is described for ease of explanation where the bed is moved in stepwise for each slice and imaging is performed.

In the embodiment shown in FIG. 13, the bed is moved in stepwise in the direction to the head from the feet, and while moving, cross sections orthogonal to the body axis are sequentially imaged. Here, each one of the slice image data items 141-1 to 141-$n$ is associated with one k-space data item shown in FIG. 12, and one slice image data is reconstructed from one k-space data item. In reconstructing the image, similar to the embodiments from the first to the third, one k-space data item is firstly subjected to the one-dimensional Fourier transform, and standard data is selected for each block from the transformed data. Then, a phase for correction is produced, and the phase is corrected so that the peak positions of echoes within the block coincide with one another. It is possible that every time when one k-space data item is collected, a phase for correction is produced and the phase correction is performed. However, in the embodiment shown in FIG. 13, every time when three pieces of slices are imaged, a new phase for correction is produced, and the phase correction using this phase is performed on each measured data for reconstructing images of the three slices.

In the bed moving imaging, since the imaging position on the subject is different by slice, there is a possibility that a local change of gradient magnetic field and/or static magnetic field inhomogeneities occurs more frequently than a static imaging. Therefore, in order to achieve an accurate correction in the bed moving direction, the phase for correction may be produced more frequently, or the phase for correction being produced is interpolated in the bed moving direction, and applied to the measured data as to which the phase for correction has not been produced. The phase-corrected data is subjected to the one-dimensional Fourier transform for each slice, and thereafter, to gridding to be rearranged in the k-space so that an image is reconstructed and image data is produced. By synthesizing the image data of each slice, a total body image data of the subject can be obtained.

According to the present embodiment, it is possible to reduce an artifact caused by the inhomogeneities of the static magnetic field and/or nonlinearity of the gradient magnetic field in the bed moving imaging using the non-Cartesian sampling method. In particular, by increasing the frequency of creating the phase for correction in the bed moving direction, an influence of the subject-dependent magnetic field inhomogeneities can be eliminated.

Hereinabove, the preferred embodiments of the present invention have been explained. The embodiments of the invention disclosed by the preceding description are intended not limiting the scope, but rather embrace any modifications that fall within the spirit and scope of the present invention. By way of example, in the embodiments above, the gradient echo pulse sequence is described. However, the radial sampling method and the hybrid radial method are independent of the pulse sequence types, and they may be applied to SE pulse sequence, FSE pulse sequence, EPI pulse sequence, and the like.

It has been also described in the embodiments of the radial MRI method and the hybrid radial method, that rotation of the k-space is performed with respect to Gr axis and Gp axis within a two-dimensional plane. However, the Gr axis and Gp axis may be associated with any of the axes of X, Y, or Z in the imaging space, and therefore, oblique imaging or off-center imaging can be executed as well. Furthermore, a rotation within a three-dimensional sphere may be available.

In the drawings, it is illustrated that there are only small number of blocks, as examples of the radial MRI method or the hybrid radial method. However, in the actual imaging, any number can be set for the number of the blocks and for the number of echoes in the block, and the same processing as described above is performed as well in any of the cases. Similarly, as for the radial MRI method, any settings are available for the number of echoes being acquired, the rotation angle, and the number of segments.

DENOTATION OF REFERENCE NUMERALS

Figure 1:
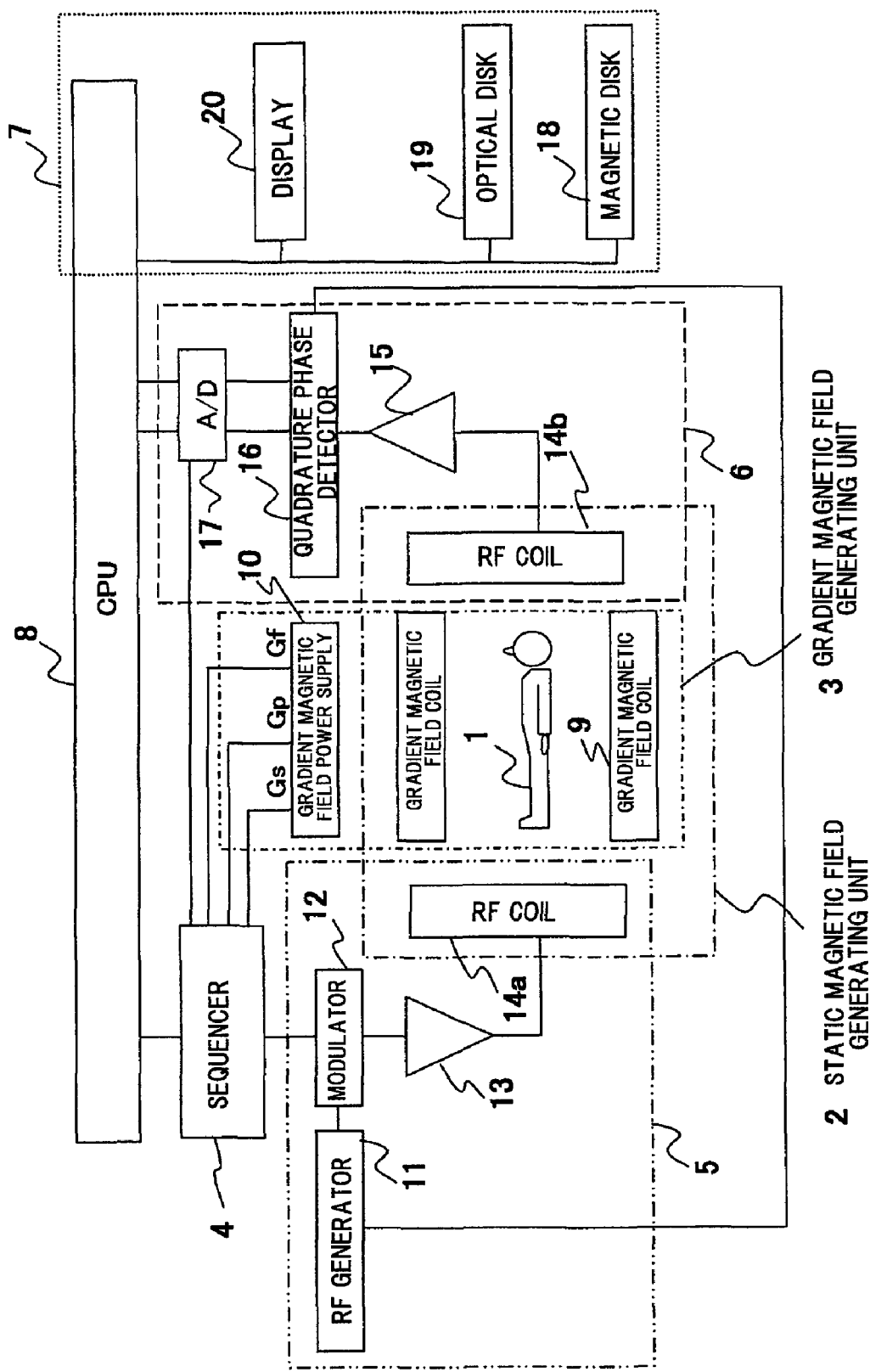
FIG. 1 illustrates an overall configuration of the MRI apparatus to which the present invention is applied.
Figure 2:
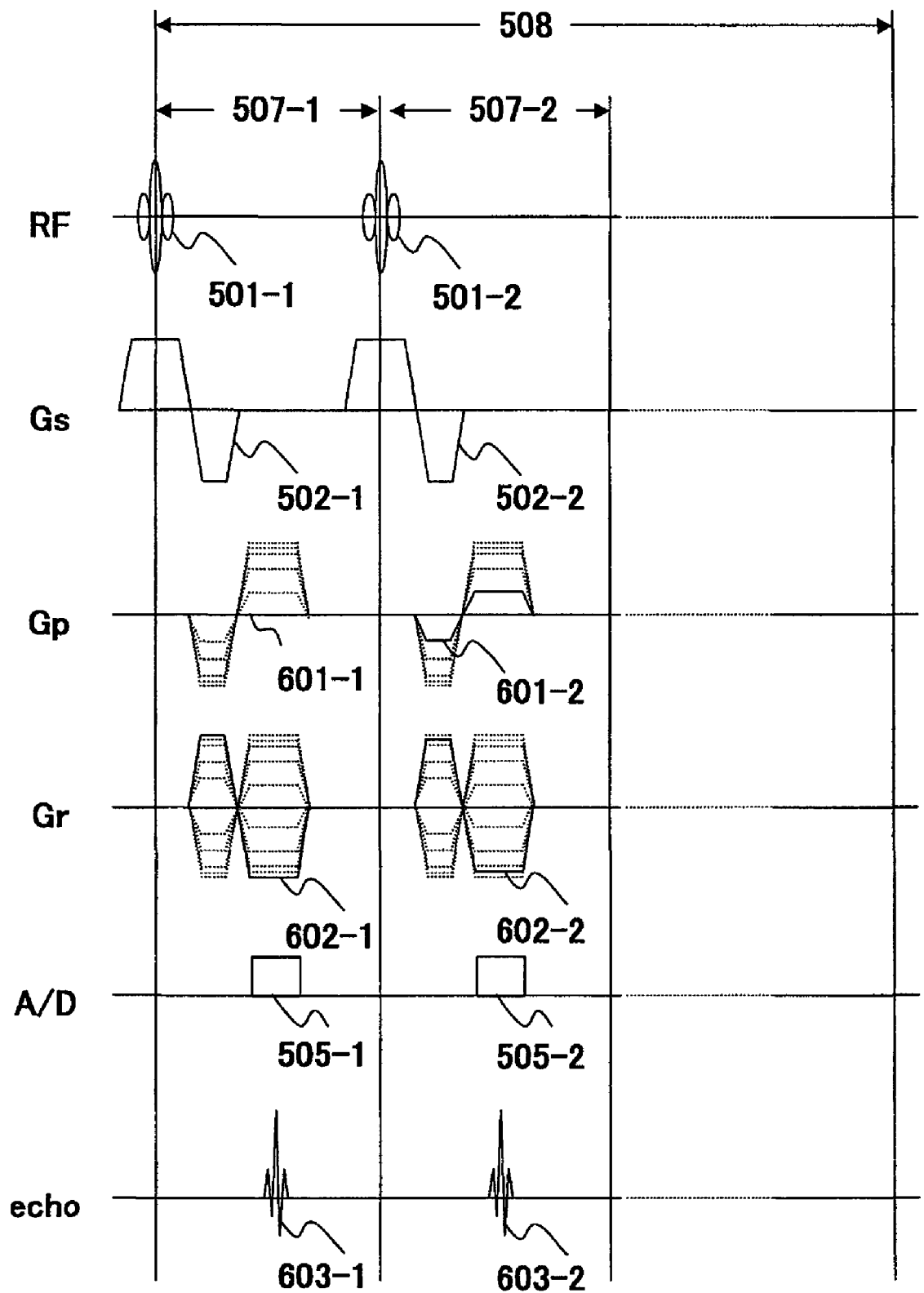
FIG. 2 illustrates a pulse sequence of a gradient echo of the radial MRI method to which the present invention is applied.
Figure 3:
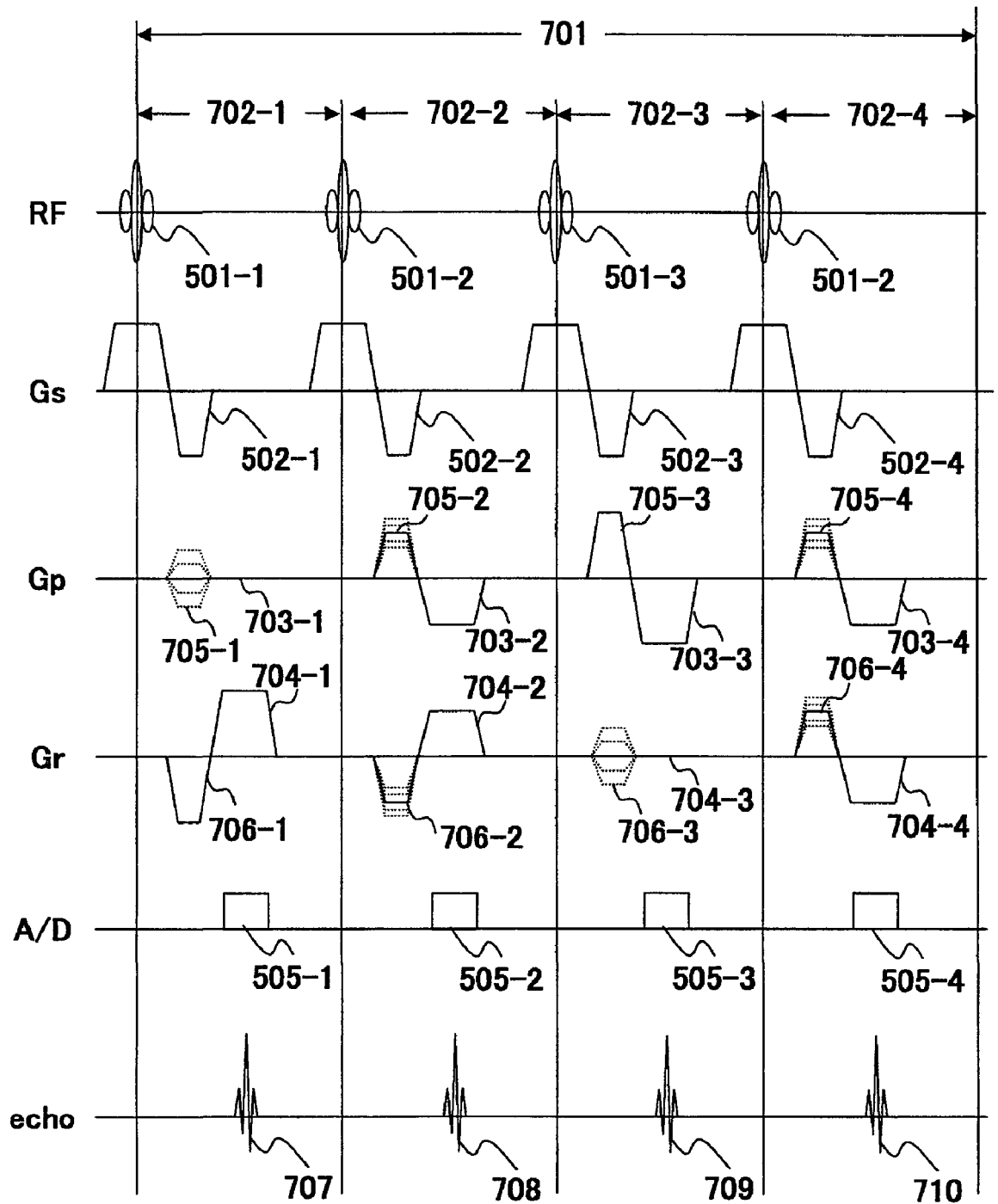
FIG. 3 illustrates a pulse sequence of the hybrid radial method to which the present invention is applied.
Figure 4:
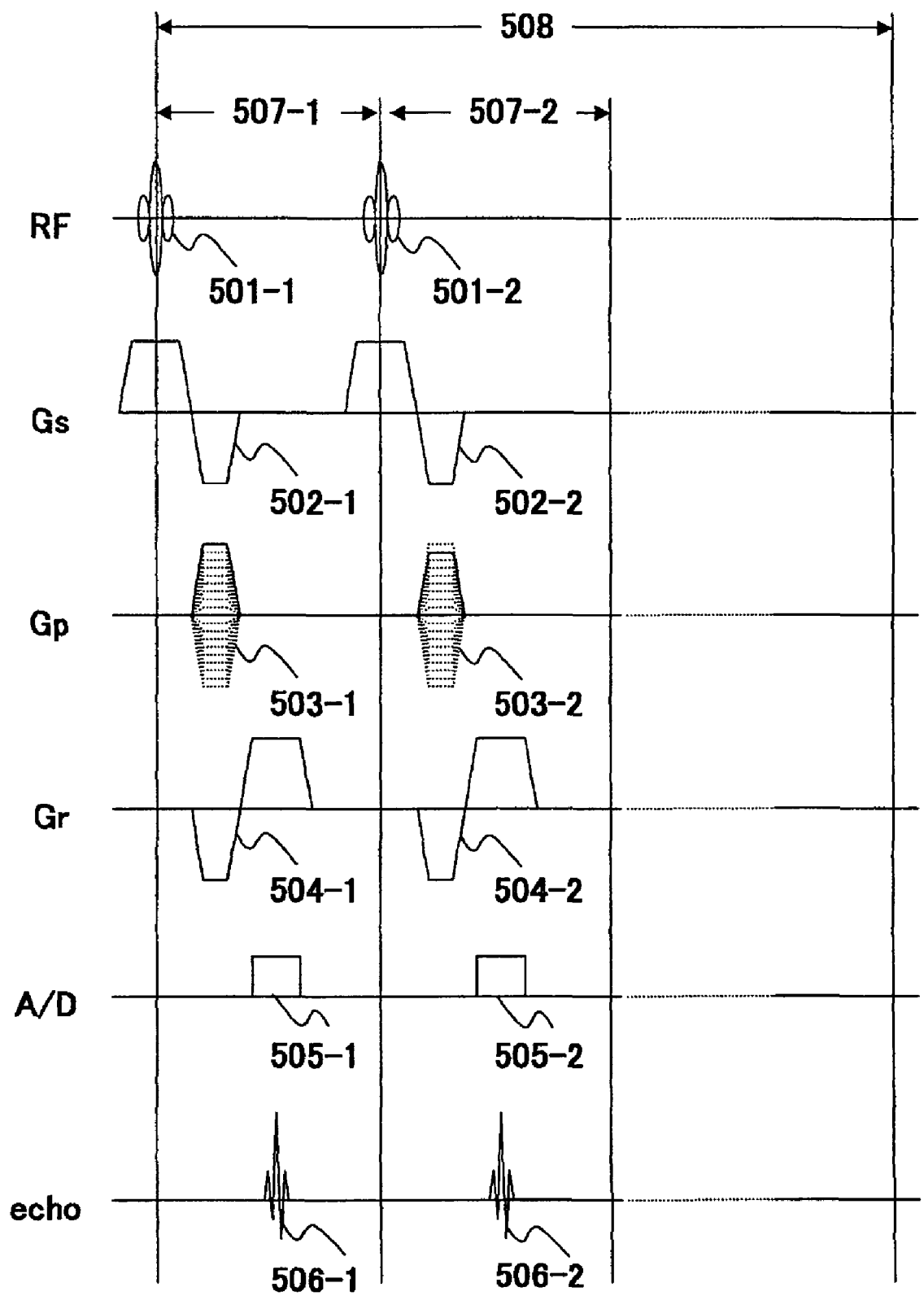
FIG. 4 illustrates a pulse sequence of a general gradient echo.
Figure 5:
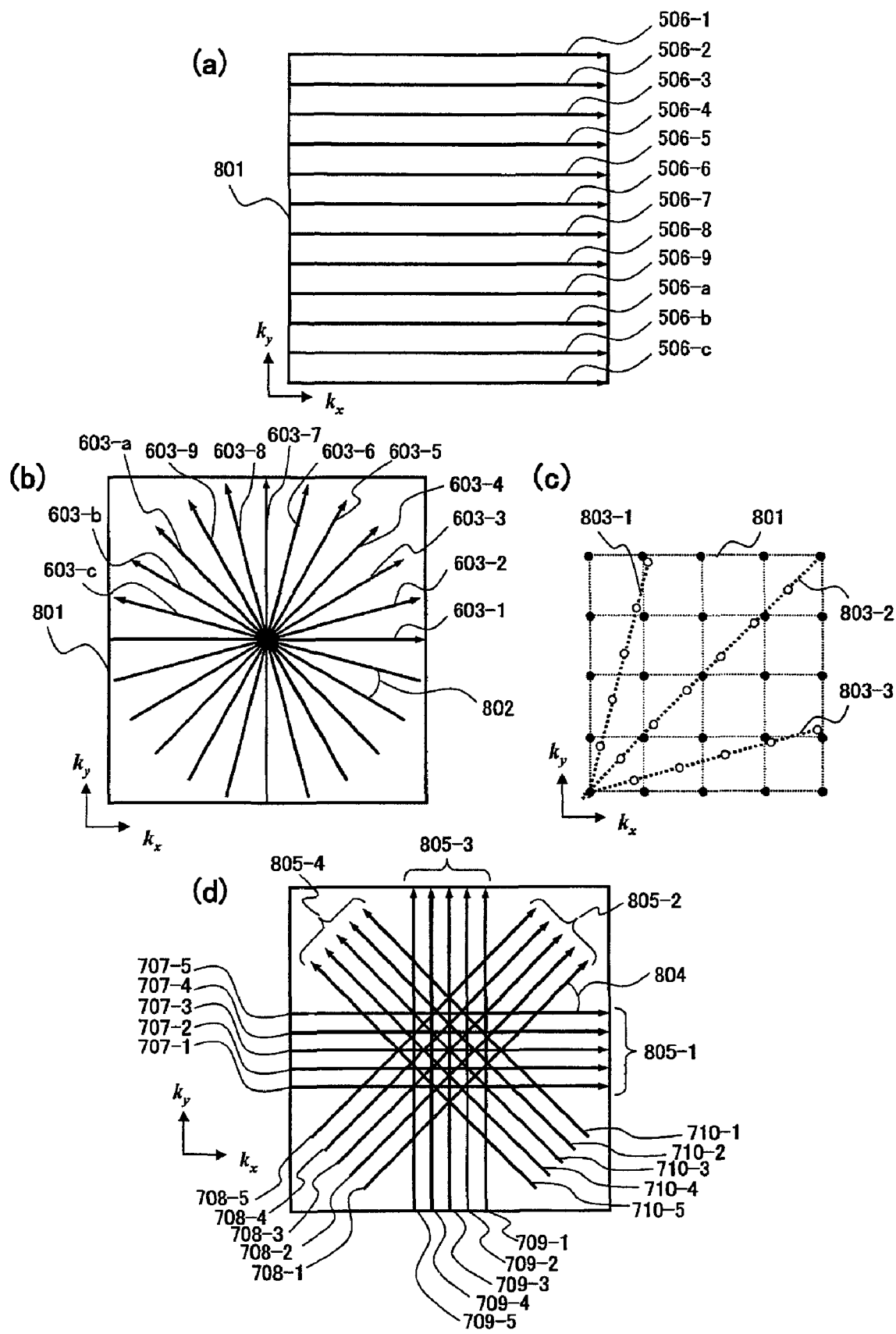
FIG. 5 illustrates sampling methods and the k-space.
Figure 6:
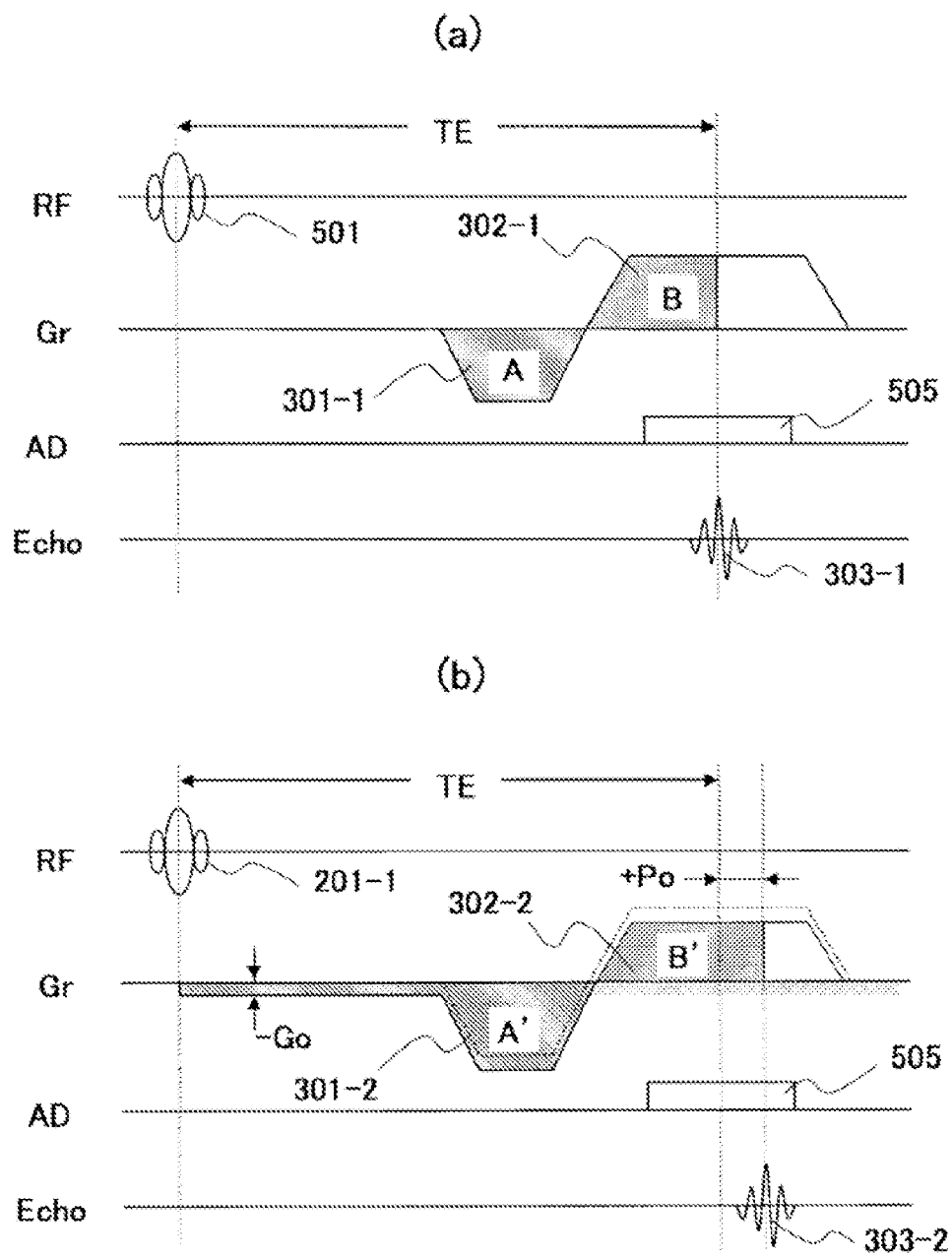
FIG. 6 illustrates an influence of a gradient magnetic field error.
Figure 7:
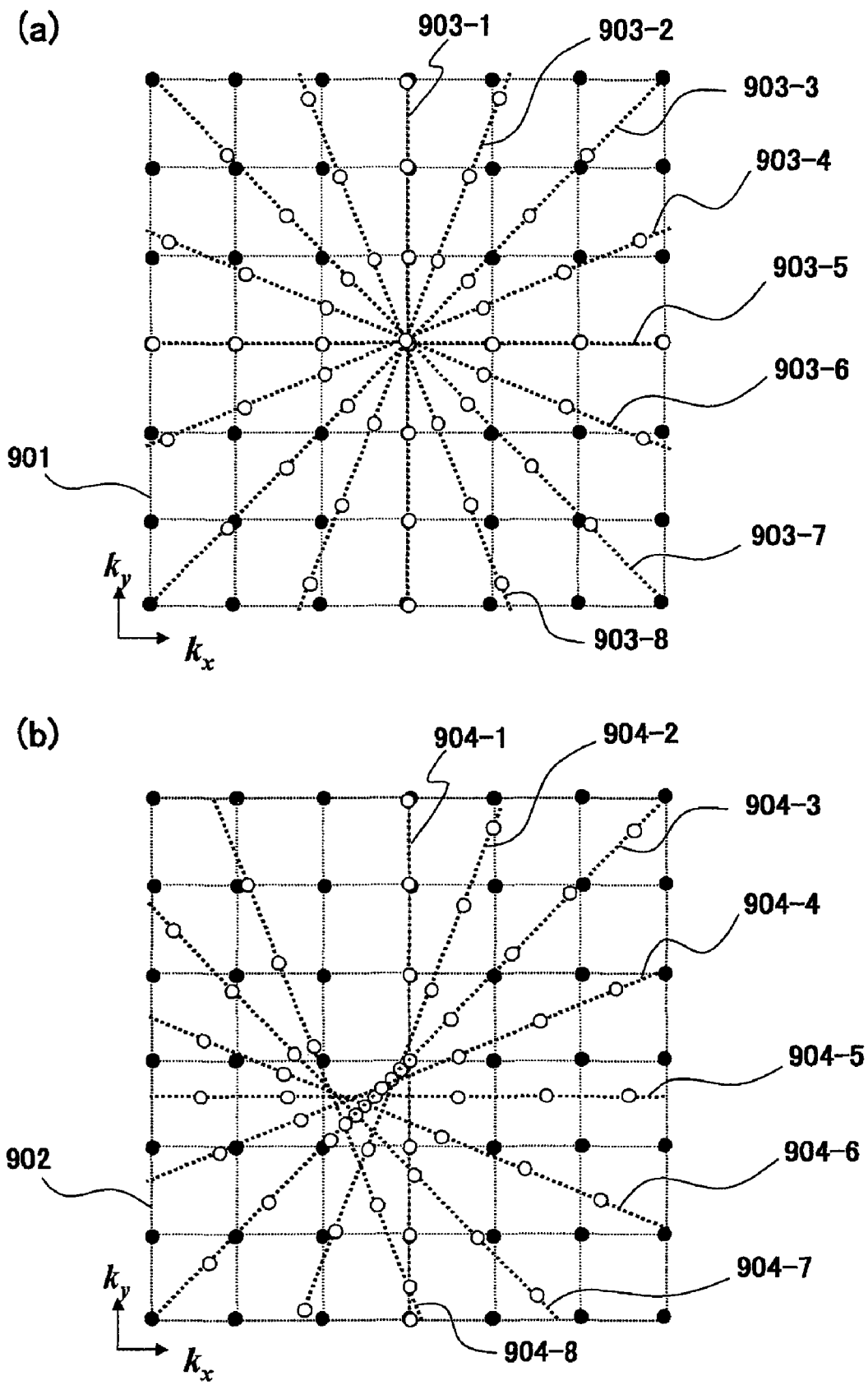
FIG. 7 illustrates an influence of a gradient magnetic field offset.
Figure 8:
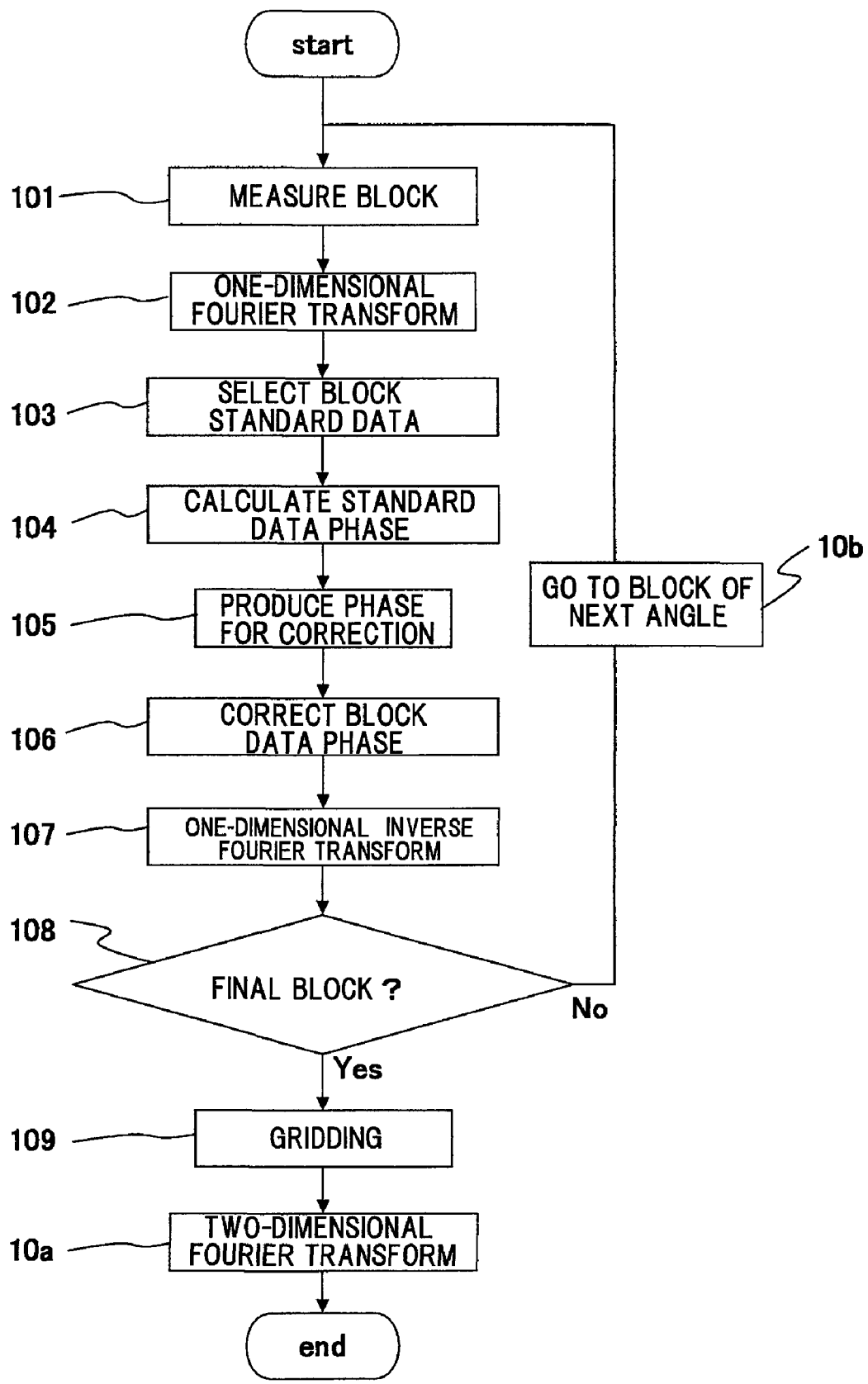
FIG. 8 is a chart for explaining a signal processing according to the first embodiment of the present invention.
Figure 9:
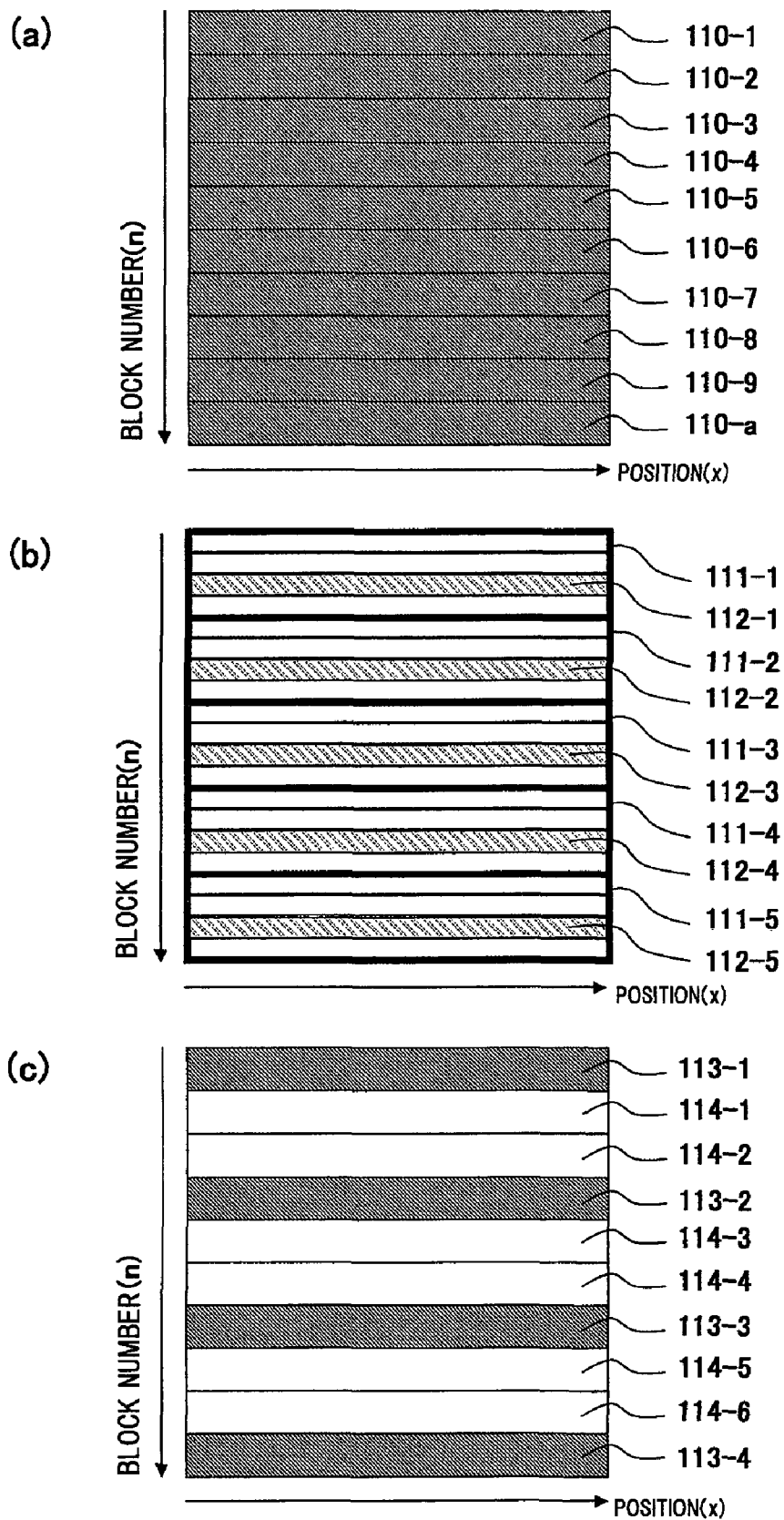
FIG. 9 illustrates signal processing of the present invention.
Figure 10:
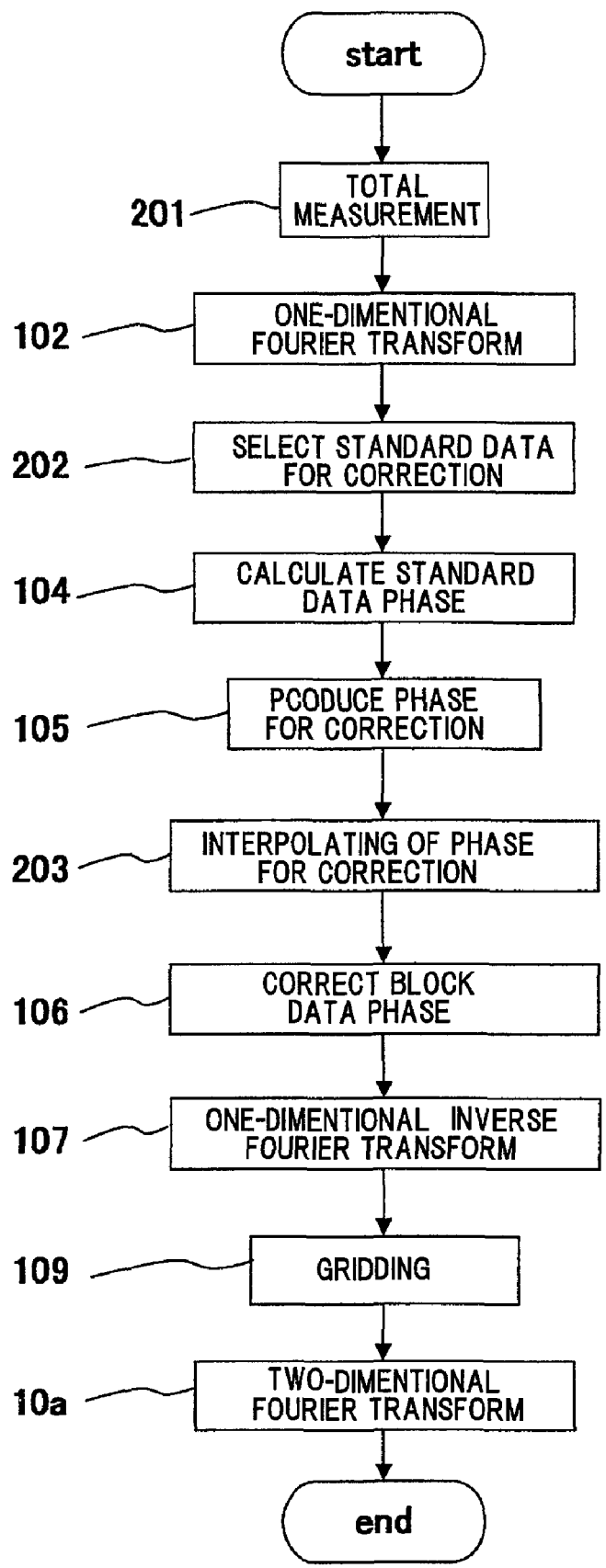
FIG. 10 is a chart for explaining a signal processing according to the second embodiment of the present invention.
Figure 11:
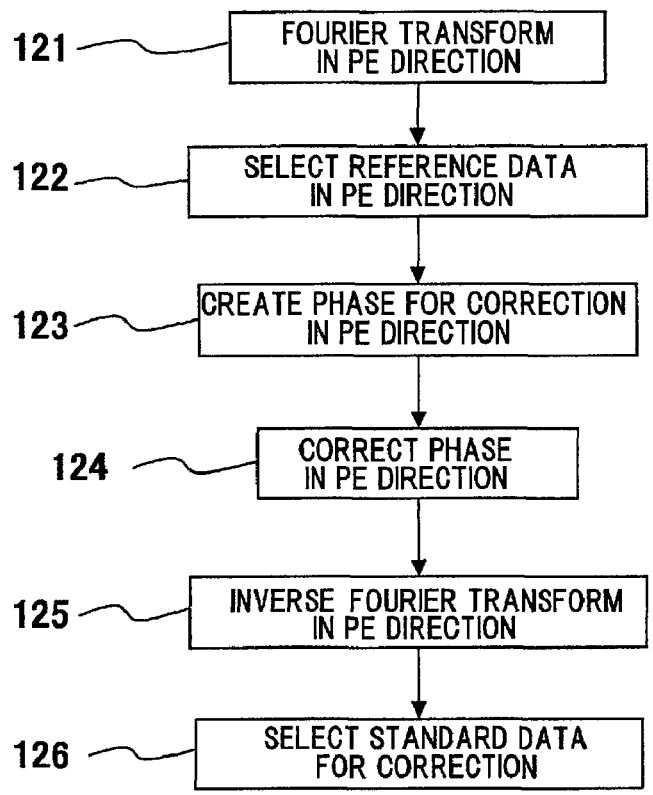
FIG. 11 is a chart for explaining a signal processing according to the third embodiment of the present invention.
Figure 12:
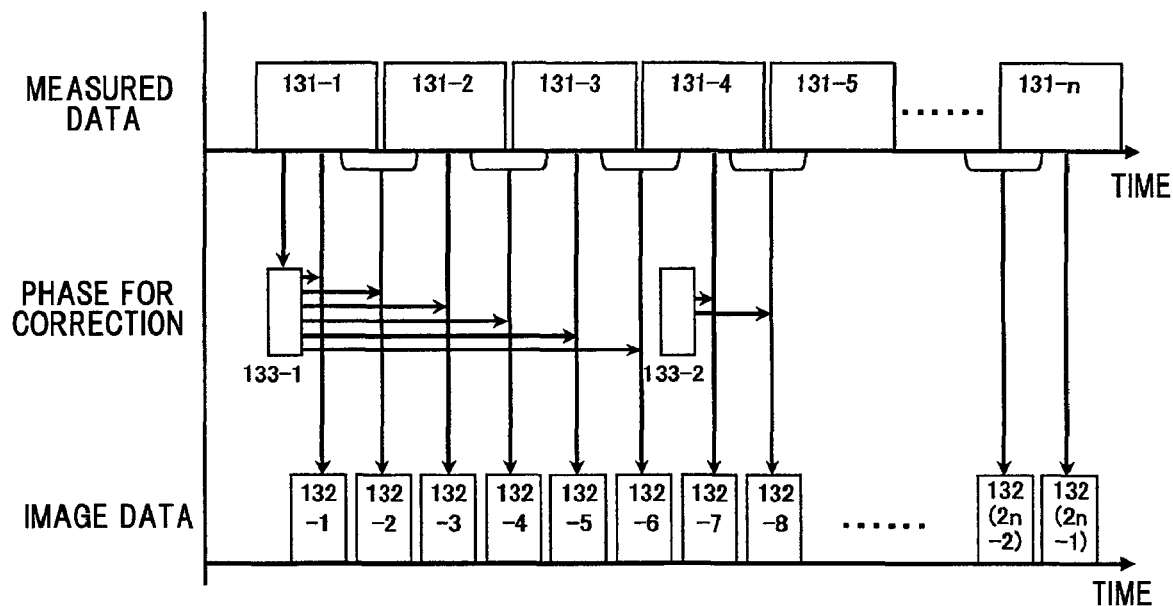
FIG. 12 illustrates the fourth embodiment in which the present invention is applied to the serial imaging.
Figure 13:
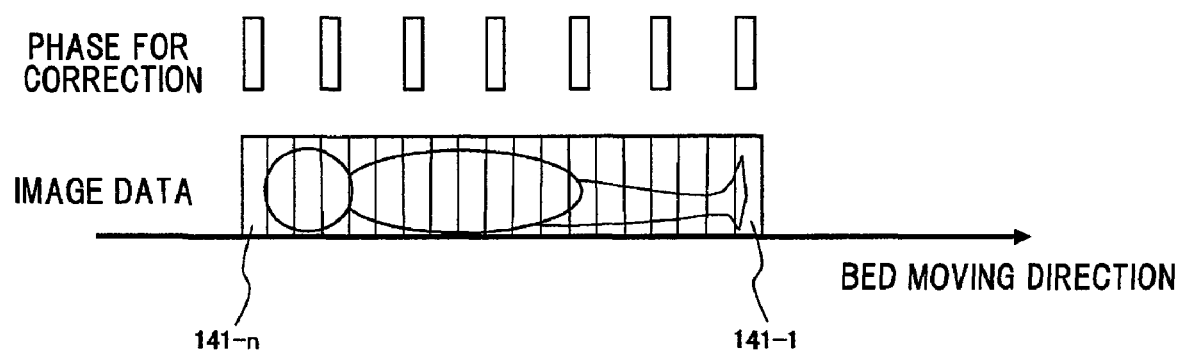
FIG. 13 illustrates the fifth embodiment in which the present invention is applied to the bed moving imaging.

1 ... SUBJECT, 2 ... STATIC MAGNETIC FIELD GENERATING UNIT, 3 ... GRADIENT MAGNETIC FIELD GENERATING UNIT, 4 ... SEQUENCER, 5 ... TRANSMITTING UNIT, 6 ... RECEIVING UNIT, 7 ... SIGNAL PROCESSING UNIT, 8 ... CENTRAL PROCESSING UNIT (CPU), 9 ... GRADIENT MAGNETIC FIELD COIL, 10 ... GRADIENT MAGNETIC FIELD POWER SUPPLY, 11 ... RF OSCILLATOR, 12 ... MODULATOR, 13 ... RF AMPLIFIER, 14a RF COIL (TRANSMITTING SIDE), 14b RF COIL (RECEIVING SIDE), 15 ... AMPLIFIER, 16 ... QUADRATURE PHASE DETECTOR, 17 ... A/D CONVERTER, 18 ... MAGNETIC DISK, 19 ... OPTICAL DISK, 20 ... DISPLAY, 501 ... RF PULSE, 502 ... SLICE SELECTIVE GRADIENT MAGNETIC FIELD, 503 ... PHASE ENCODING GRADIENT MAGNETIC FIELD PULSE, 504 ... FREQUENCY ENCODING GRADIENT MAGNETIC FIELD PULSE, 505 ... DATA SAMPLE WINDOW, 506 ... ECHO SIGNAL, 507 ... REPETITION TIME INTERVAL, 508 ... IMAGE ACQUISITION TIME

What is claimed is:

1. A magnetic resonance imaging apparatus comprising;
an imaging means comprising a means for generating magnetic fields respectively of a static magnetic field, a gradient magnetic field, and an RF magnetic field, and a means for receiving an echo signal generated from a subject, the imaging means being for measuring echo data associated with at least one measurement trajectory in k-space, while varying angles of the measurement trajectory with respect to a coordinate axis in the k-space, so as to collect at least one measured data for each of the angles; and
an image reconstruction means for rearranging the measured data in the k-space and reconstructing an image; wherein,
the image reconstruction means further comprises a phase correction means for calculating a phase for correction based on standard data selected from the measured data for each of the angles, prior to rearranging the measured data in the k-space, and for performing a phase correction on the measured data, by using the calculated phase for correction.

2. The magnetic resonance imaging apparatus according to claim 1, wherein,
the imaging means measures one echo corresponding to one measurement trajectory as to one angle, and the image reconstruction means sets the one echo as the standard data.

3. The magnetic resonance imaging apparatus according to claim 1, wherein,
the imaging means measures multiple echoes corresponding to multiple parallel trajectories to which phase encoding is applied, as to one angle, and the image reconstruction means sets at least one echo selected from the multiple echoes as the standard data.

4. The magnetic resonance imaging apparatus according to claim 1, wherein,
the phase correction means subjects the standard data to the Fourier transform with respect to one coordinate axis in the k-space, and a phase of the transformed data at a position where the subject exists is set as the phase for correction.

5. The magnetic resonance imaging apparatus according to claim 1, wherein,
the phase correction means subjects the standard data to the Fourier transform with respect to one coordinate axis in the k-space, and a phase of the transformed data is set as the phase for correction, so as to be used for correction as to each coordinate position.

6. The magnetic resonance imaging apparatus according to claim 1, wherein,
the phase correction means subjects the standard data to the Fourier transform with respect to one coordinate axis in the k-space, and subjects a phase of the transformed data to a function fitting to be set as the phase for correction.

7. The magnetic resonance imaging apparatus according to claim 3, wherein,
the phase correction means performs the phase correction in such a manner that peak positions of multiple echoes measured at the same angle approximately agree with one another.

8. The magnetic resonance imaging apparatus according to claim 1, wherein,
the phase correction means comprises a means for interpolating the phase for correction as to an angle not selected, based on the phase for correction of each of multiple angles being selected.

9. The magnetic resonance imaging apparatus according to claim 8, wherein,
the phase correction means comprises a means for fitting the phase for correction obtained for each of the angles to a function, in a direction orthogonal to a radial direction.

10. The magnetic resonance imaging apparatus according to claim 3, wherein,
the phase correction means selects as standard data, an echo whose phase encoding is zero, from the multiple echoes acquired as to one angle.

11. The magnetic resonance imaging apparatus according to claim 10, wherein,
the phase correction means firstly corrects the phase in the phase encoding direction, for the multiple echoes acquired as to one angle, and thereafter, selects the standard data.

12. The magnetic resonance imaging apparatus according to claim 11, wherein,
the phase correction means subjects the multiple echoes to the Fourier transform in the phase encoding direction, and corrects the phase in the phase encoding direction, by using a phase of a center position in the readout direction of the transformed data.

13. The magnetic resonance imaging apparatus according to claim 11, wherein,
the phase correction means subjects the multiple echoes to the Fourier transform in the phase encoding direction, and fits the transformed data to a function so as to correct the phase in the phase encoding direction.

14. The magnetic resonance imaging apparatus according to claim 1, wherein,
the imaging means measures echo data associated with at least one measurement trajectory in the k-space, while varying an angle of the measurement trajectory with respect to the coordinate axis in the k-space, and repeats acquiring sets of measured data, and
the phase correction means selects one of the sets of the measured data to calculate a phase for correction, and by using this phase for correction, the other sets of measured data is corrected.

15. The magnetic resonance imaging apparatus according to claim 1, further comprising a transfer means for moving the subject in the static magnetic field, wherein,
the imaging means repeats acquiring sets of measured data, as to the echo data associated with at least one measurement trajectory in the k-space, while varying the angles of the measurement trajectory with respect to the coordinate axis in the k-space, in sync with moving of the subject by the transfer means, and
the phase correction means updates, in the repetition, the phase for correction for each acquisition of the at least one of the sets of the measured data, and corrects the phase by applying the updated phase for correction to the measured data acquired after the updating.

16. An image reconstruction method for applying a gradient magnetic field and an RF magnetic field to a subject placed in a static magnetic field, in accordance with a predetermined pulse sequence, and reconstructing an image of the subject, by using data radially measured while varying angles with respect to a coordinate axis in k-space, comprising the following:
a step for executing, for measured data as to each angle, the processing of
(1) subjecting one or multiple measured data measured at an identical angle to one-dimensional Fourier transform,
(2) selecting at least one standard data from one or multiple measured data after the Fourier transform is performed,
(3) creating a phase for correction from the standard data being selected,
(4) correcting one or multiple measured data that is measured at the identical angle, by using the phase for correction, and
(5) subjecting one or multiple measured data having been corrected to one-dimensional inverse Fourier transform,
a step of rearranging the data on lattice points in the k-space, by interpolation using the measured data of each angle after the one-dimensional inverse Fourier transform is performed, and
a step of reconstructing an image by the Fourier transform, from the data rearranged in the k-space.

17. The image reconstruction method according to claim 16, wherein,
the processing of (3) creating the phase for correction further comprises the processing of:
(3-1) creating the phase for correction from the phase of the standard data being selected, and
(3-2) creating by interpolation, the phase for correction of the angle not selected, by using the phase for correction produced as to multiple angles being selected.

18. The image reconstruction method according to claim 16, wherein,
the measured data of each angle includes multiple echoes different in phase encoding, the processing of (2) selecting the standard data comprises the processing of:
(2-1) subjecting the multiple echoes to the Fourier transform in the phase encoding direction,
(2-2) selecting reference data from the data subjected to the Fourier transform in the phase encoding direction,
(2-3) creating the phase for correction in the phase encoding direction by using the reference data,
(2-4) correcting the data subjected to the Fourier transform by using the phase for correction in the phase encoding direction, and
(2-5) subjecting the data after correction to the inverse Fourier transform in the phase encoding direction, and the standard data is selected after the inverse Fourier transform is performed.

* * * * *